United States Patent [19]

Subrahmanyan et al.

[11] Patent Number: 5,411,400

[45] Date of Patent: May 2, 1995

[54] INTERCONNECT SYSTEM FOR A SEMICONDUCTOR CHIP AND A SUBSTRATE

[75] Inventors: Ravichandran Subrahmanyan, Scottsdale; Ravinder K. Sharma, Mesa; William H. Lytle, Chandler; Barry C. Johnson, Scottsdale, all of Ariz.

[73] Assignee: Motorola, Inc., Schaumburg, Ill.

[21] Appl. No.: 209,353

[22] Filed: Mar. 14, 1994

Related U.S. Application Data

[63] Continuation of Ser. No. 952,008, Sep. 28, 1992, abandoned.

[51] Int. Cl.⁶ ............................................. H01R 9/09
[52] U.S. Cl. ............................................ 439/68; 439/75; 361/636; 257/775
[58] Field of Search ................... 439/74, 75, 68, 69, 439/70; 257/41, 773, 775, 737, 734, 726, 727, 777, 718; 361/785, 791, 636

[56] References Cited

U.S. PATENT DOCUMENTS

| | | | |
|---|---|---|---|
| 2,805,294 | 9/1957 | Edmunds | 200/50 B |
| 3,268,774 | 8/1966 | Ortner | 439/69 |
| 3,526,867 | 9/1970 | Keeler, II | 439/74 |
| 3,577,037 | 5/1971 | DiPietro et al. | 257/777 |
| 3,641,474 | 2/1972 | Owens | 257/718 |
| 3,686,698 | 8/1972 | Akeyama et al. | 257/737 |
| 4,015,707 | 4/1977 | Kisor | 439/68 |
| 4,439,270 | 3/1984 | Powell et al. | 257/734 |
| 4,601,526 | 7/1986 | White et al. | 257/727 |
| 4,912,545 | 3/1990 | Go | 257/737 |
| 5,010,389 | 4/1991 | Gansauge et al. | 257/737 |
| 5,059,130 | 10/1991 | Miller, Jr. | 439/74 |
| 5,070,529 | 12/1991 | Beaufort et al. | 439/74 |
| 5,214,308 | 5/1993 | Nishiguchi et al. | 257/773 |

FOREIGN PATENT DOCUMENTS

2508343  9/1976  Germany ............................... 29/829

*Primary Examiner*—Mark Rosenbaum
*Assistant Examiner*—David P. Bryant
*Attorney, Agent, or Firm*—Gary W. Hoshizaki

[57] ABSTRACT

A plurality of inserts (12) formed on a first substrate (11). A plurality of sockets (14) formed on a second substrate (13). Each socket of the plurality of sockets (14) on the second substrate (13) has a corresponding insert from the plurality of inserts (12) which physically aligns for coupling. At least one of the first (11) or second (13) substrates must be a semiconductor substrate. This arrangement allows for electrically connecting a semiconductor device or structure to another device for testing, burn-in, or final assembly.

19 Claims, 5 Drawing Sheets

INTERCONNECT SYSTEM FOR A SEMICONDUCTOR CHIP AND A SUBSTRATE

This application is a continuation of prior application Ser. No. 07/952,008, filed Sep. 28, 1992, now abandoned.

BACKGROUND OF THE INVENTION

This invention relates, in general, to interconnect technology, and more particularly to the interconnection of a semiconductor chip to a substrate.

Integrated circuits or semiconductor chips are being designed to form systems of increased complexity and performance. Advances in semiconductor chip technology have drastically increased the functionality and speeds of a semiconductor chip; these advances are mainly due to smaller device sizes and multiple layers of interconnect. Likewise, the increased functionality and speed of an individual semiconductor chip has increased the number of off chip connections which must be made when coupling multiple integrated circuits to form a system. Performance is not only linked to individual integrated circuit speeds but also interconnect delay between semiconductor chips. The pursuit of high density/high performance chip to chip interconnect has brought about many new concepts to this technology.

A popular solution to minimize performance impacts of inter-chip connections is to mount semiconductor chips on a common substrate. The common substrate has one or more layers of interconnect to couple the semiconductor chips together. The semiconductor chips are mounted as close as possible on the common substrate to minimize interconnect distance between chips. Assuming a common substrate approach is utilized to interconnect multiple semiconductor chips it is still imperative to develop a reliable means of coupling each external connection terminal of each semiconductor chip to a corresponding connection terminal on a common substrate.

Many types of interconnect have been developed for coupling semiconductor chip external connection terminals to a substrate. Among the most popular connection schemes are bumping processes. A raised conductive bump is placed on each external connection terminal of a semiconductor chip and/or a corresponding group of terminals on a substrate. Aligning and placing a semiconductor chip on a substrate allows each conductive bump to connect an external connection terminal of a semiconductor chip to a corresponding terminal on the substrate. Conductive bumps form not only an electrical connection but also a physical connection which holds a semiconductor chip to a substrate. Conductive bumps can be formed from many types of materials ranging from solder to conductive polymers. Each type of material used to form a conductive bump will have it's own process flow and production requirements.

General problems with bumping include process temperatures (for some types of bumping), difficulty of rework, testing, the ability to bump semiconductor chips from outside vendors, and cost. Bumping is a solution that many manufacturers have pursued despite these difficulties because it allows the formation of a high performance multiple chip system in a small area.

It would be of great benefit if an external interconnect system could be developed that couples a semiconductor chip's external connection terminals to a corresponding group of terminals on a substrate which is low cost, uses existing process technology and equipment, has a small number of process steps, can provide permanent or temporary connection, and is easily formed on a majority of semiconductor chips currently sold on the open market. Such an interconnect system would be of great benefit in post-manufacturing testing and burn-in testing.

SUMMARY OF THE INVENTION

Briefly stated, this invention comprises a plurality of inserts formed on a first substrate and a plurality of sockets formed on a second substrate which correspond and align to the inserts on the first substrate. At least one of the first or second substrates must be formed from a semiconductor material.

DETAILED DESCRIPTION OF THE DRAWINGS

Figure 1:
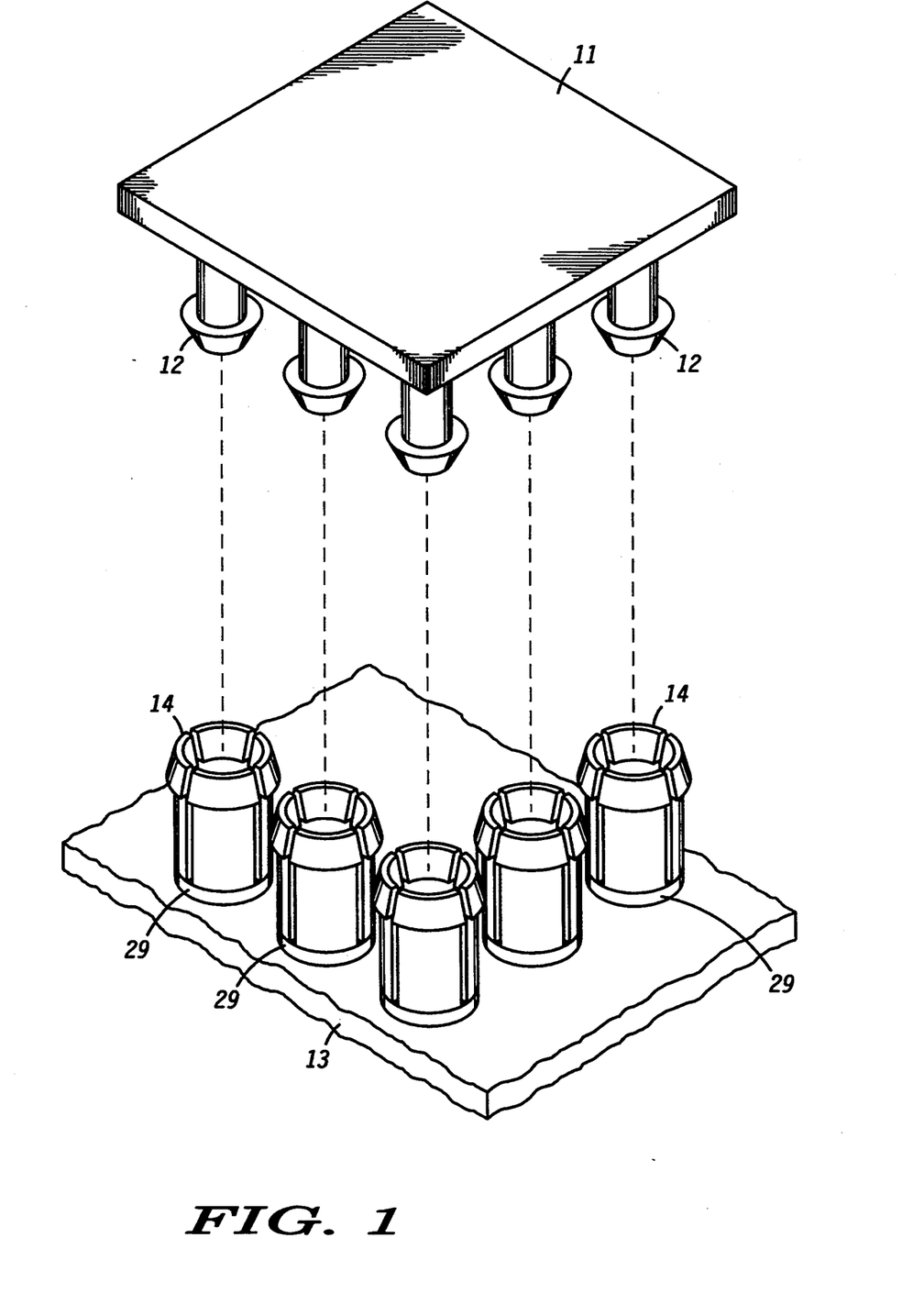
FIG. 1 is an illustration of a semiconductor chip having a plurality of inserts aligned to a substrate having a plurality of sockets in accordance with the present invention.

FIG. 1 is an illustration of a semiconductor chip having a plurality of inserts aligned to a corresponding plurality of sockets on a substrate in accordance with the present invention.

A substrate 11 has a plurality of inserts 12 for interconnection to a substrate 13. Inserts 12 are preferably made of metal although other conductive materials may be used. Inserts 12 extend vertically from a surface of substrate 11. In the preferred embodiment, substrate 11 is a semiconductor substrate. Inserts are placed on substrate 11 which allows substrate 11 to be temporarily or permanently coupled to other substrates having sockets which align to inserts 12. Diagnostics, testing, or burn-in can be performed by temporarily coupling substrate 11 to a test fixture prior to final assembly which can be used to reduce system failures. An interconnect methodology which can form sockets which allow temporary or permanent coupling increases flexibility over other interconnect technologies such as thermocompression or solder bumping due to the permanent nature of such a connection.

A plurality of sockets 14 are formed on substrate 13, each socket (14) aligns to a corresponding insert 12 on semiconductor chip 11. Sockets 14 are preferably made of metal although other conductive materials may be used. In this embodiment each insert couples or mates vertically to a corresponding socket which is illustrated by dotted lines. In the preferred embodiment, each socket has a base region 29 formed to increase structural integrity of each socket 14. Base region 29 will be described in greater detail hereinafter. By aligning inserts 12 to sockets 14 and mating substrates 11 and 13 together in a vertical direction, sockets 14 will receive inserts 12 forming an electrical and physical connection.

External connection terminal density on a substrate can vary drastically depending on the technology used. In the preferred embodiment, external connection terminals (in which inserts or sockets are formed) are metal pads. A typical metal pad size for substrate 11 and substrate 13 is 0.125 mm×0.125 mm. It is possible to have hundreds or thousands of external connection terminals (metal pads) on a substrate.

In the preferred embodiment, substrate 13 is a semiconductor substrate and has at least one layer of interconnect. Generally, a plurality of integrated circuits are coupled together on a substrate maximizing circuit density and minimizing interconnect length. Substrate 13 can be formed from many materials such as ceramic material, semiconductor material, glass, organic, material, or the like. Choice of substrate materials is usually a function of system constraints, cost, manufacturing concerns, and physical properties such as temperature coefficient of expansion.

Figure 2:
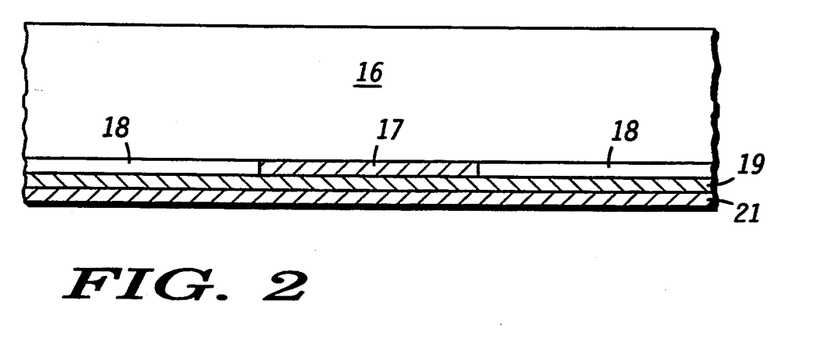
FIG. 2 is a cross-sectional view of a first substrate illustrating process steps for forming an insert.

FIG. 2 is a cross-sectional view of a first substrate illustrating process steps for forming an insert.

Formation of an insert and a socket can be best described by illustrating process steps in sequence. Process steps which figure prominently in the formation of an insert or socket will be described in detail. Fabrication for both inserts and sockets are similar to one another although a socket has additional steps.

A semiconductor substrate 16 has an external connection terminal 17 on which an insert will be formed. External connection terminal 17 is an input/output pad commonly found on integrated circuits. External connection terminal 17 is typically formed from aluminum or an aluminum alloy. In this embodiment external connection terminal is a square shaped pad having dimensions of approximately 0.125 mm×0.125 mm. Input/output pads are used to make external connections from an integrated circuit. Dimensions and shapes of an input/output pad will vary depending on the process technology and the type of interconnect used to couple to the input/output pad. An isolation layer 18 is formed around external connection terminal 17 as an isolation and planarization layer. Isolation layer 18 can be formed of such materials as $SiO_2$, $Si_3N_4$, or polyimide. A refractory metal layer 19 is formed on substrate 16 to a thickness of approximately 200 nm (nanometers). Refractory metal layer 19 connects and bonds to external connection terminal 17. A metal layer 21 is then formed on refractory metal layer 19. In the preferred embodiment, metal layer 21 is copper and is formed to a thickness of approximately 1 micron. Refractory metal layer 19 and metal layer 21 are formed by a physical vapor deposition process such as sputtering. Refractory metal layer 19 is an intermediate layer which bonds to both aluminum and copper. Placing copper directly on aluminum or an aluminum alloy can form an intermetallic compound or intermediate phase which is brittle and has poor conductive qualities, therefore intermediate layer 19 is used. When referring to a metal in this description it will be understood that a metal such as copper or aluminum may also refer to an alloy of copper or an alloy of aluminum (for example).

Figure 3:
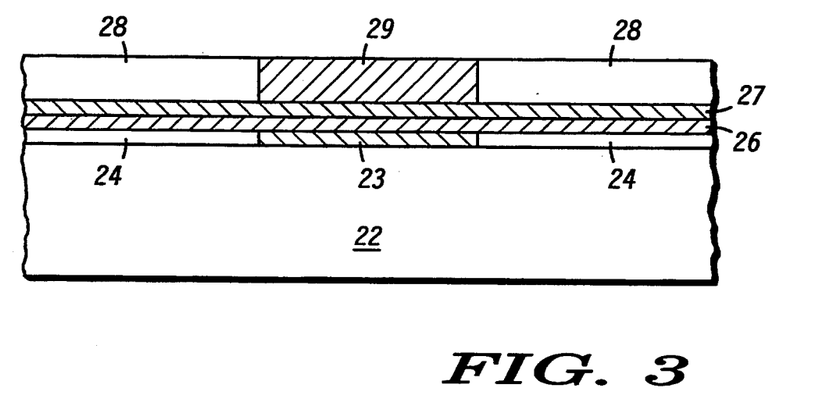
FIG. 3 is a cross-sectional view of a second substrate illustrating process steps for forming a socket.

FIG. 3 is a cross-sectional view of a second substrate illustrating process steps for forming a socket. In this embodiment, the socket illustrated is formed for vertical coupling, process steps for forming a socket for horizontal coupling are similar.

A substrate 22 has an external connection terminal 23 which aligns to external connection terminal 17 (FIG. 2) of substrate 16 (FIG. 2). A socket will be formed on external connection terminal 23. Like external connection terminal 17 of FIG. 2, external connection terminal 23 is an input/output pad commonly found on integrated circuits, external connection terminal 23 is typically formed from aluminum or an aluminum alloy. In this embodiment external connection terminal 23 is a square shaped pad having dimensions of approximately 0.125 mm×0.125 mm. An isolation layer 24 is formed around external connection terminal 23. Isolation layer 24 can be formed of such materials as $SiO_2$, $Si_3N_4$, or polyimide. A refractory metal layer 26 is formed on external connection terminal 23 and isolation layer 24 to a height of approximately 200 nm. A metal layer 27 is then formed on refractory metal layer 26. In the preferred embodiment, metal layer 27 is copper and is formed to a thickness of approximately 1 micron. Metal sputtering is used to form refractory metal layer 26 and metal layer 27 on substrate 22.

The previous steps are similar to steps described in FIG. 2 but additional steps are needed to form a socket. A layer of photoresist 28 is patterned on metal layer 27 leaving an opening which aligns to external connection terminal 23. The opening exposes metal layer 27. Layer of photoresist 28 is formed on metal layer 27 having a thickness of approximately 5 microns.

An electroplating process is used to form a base 29. Electroplating metal is a well defined art which is a simple low temperature process, applicable to a production environment, inexpensive and can form accurate detailed shapes in conjunction with patterned photoresist. In the preferred embodiment, copper is used as the electroplated metal. A voltage is applied to metal layer 27. The voltage induces copper ions to migrate and form in areas not covered by photoresist. Copper is electroplated up to a height equal to or less than the thickness of photoresist 28 forming base 29.

Figure 4:
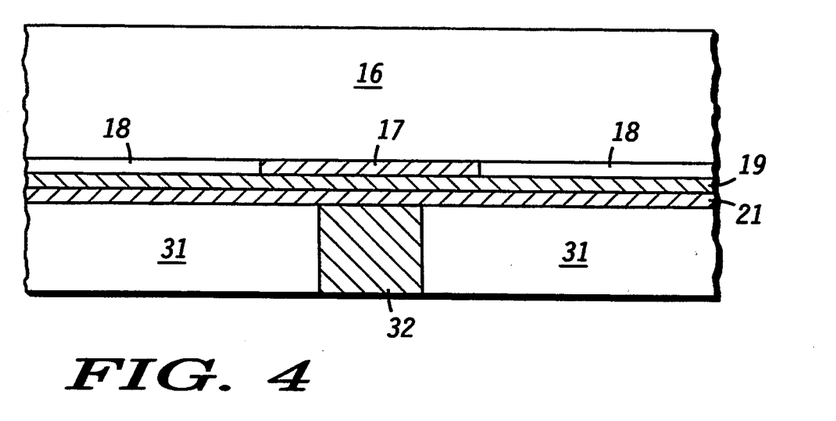
FIG. 4 is a further illustration of FIG. 2 illustrating formation of a cylindrical base.

FIG. 4 is a further illustration of FIG. 2 illustrating formation of a cylindrical base of an insert.

A layer of photoresist 31 is placed on layer 21. Layer of photoresist 31 is patterned having a cylindrical opening centrally located over external connection terminal 17. The cylindrical opening exposes metal layer 21. Layer of photoresist 31 is formed having a thickness of approximately 50 microns.

In the preferred embodiment, copper is used as the electroplated metal. A voltage is applied to metal layer 21. The voltage induces copper ions to migrate and form in the cylindrical opening forming cylindrical base 32. In the preferred embodiment, cylindrical base 32 has a diameter of approximately 50 microns. In the preferred embodiment, copper is electroplated up to a height equal to or less than the thickness of layer of photoresist 31.

Figure 5:
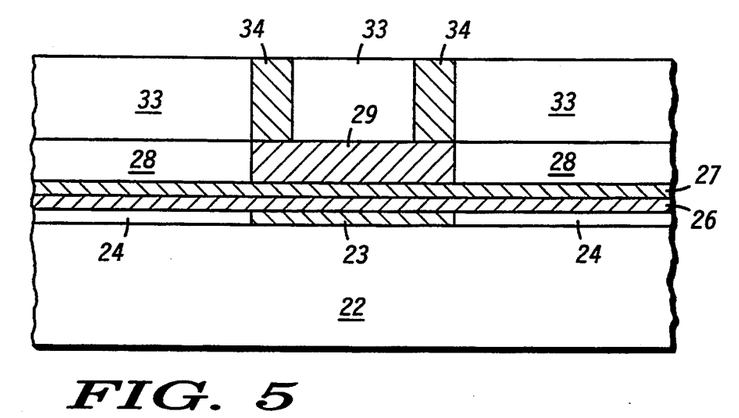
FIG. 5 is a further illustration of FIG. 3 illustration formation of a sectioned ring.

FIG. 5 is a further illustration of FIG. 3 illustrating formation of a sectioned ring of a socket.

A layer of photoresist 33 is placed on photoresist layer 28 and base 29. Layer of photoresist 33 is patterned to form a sectioned ring 34 on base 29. Layer of photoresist 33 has a thickness of approximately 45 microns. Copper is electroplated on areas exposing base 29 forming sectioned ring 34. A gap (not shown) is formed between each sectioned ring 34 by placing photoresist (layer of photoresist 33) in the gap area to prevent metal from electroplating. Each section of sectioned ring 34 has a wall thickness of approximately 25 microns and together forms an opening having a diameter of approximately 75 microns. Completed sectioned ring 34 will flex outwards when an insert is inserted through the opening. Base 29 is formed to the predetermined thickness and of the same material as sectioned ring 34 to form a strong bond where base 29 connects to sectioned ring 34. A strong bond between base 29 and sectioned ring 34 allows each section of sectioned ring 34 to flex without breaking.

Figure 6:
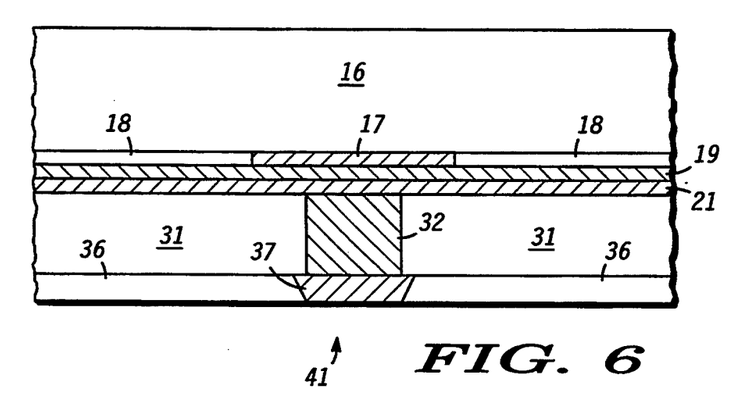
FIG. 6 is a further illustration of FIG. 4 illustrating formation of a flanged circular head.

FIG. 6 is a further illustration of FIG. 4 illustrating formation of a flanged head on a cylindrical base. The cylindrical base and the flanged head form an insert.

Placing flanges on cylindrical base 32 and sectioned ring 34 serves to help alignment when inserting an insert into a socket, forces contact between insert and socket, and retains an insert in a socket. Contact area is critical to insure a low resistance electrical connection. Retaining an insert in a socket is critical to prevent contact from being broken.

A layer of photoresist 36 is formed on photoresist layer 31 and cylindrical base 32 to pattern a flanged circular head 37 centrally on cylindrical base 32. Layer of photoresist 36 is overexposed to provide a tapered opening exposing cylindrical base 32. Layer of photoresist 36 is formed having a thickness of approximately 25 microns. Copper is electroplated onto cylindrical base 32 through the tapered opening forming flanged circular head 37. Flanged circular head 37 has a thickness of approximately 25 microns and a diameter of approximately 75 microns (at the widest point of the flange) which corresponds to the diameter of the opening of sectioned ring 34. Cylindrical base 32 and flanged circular head 37 form an insert 41.

Figure 7:
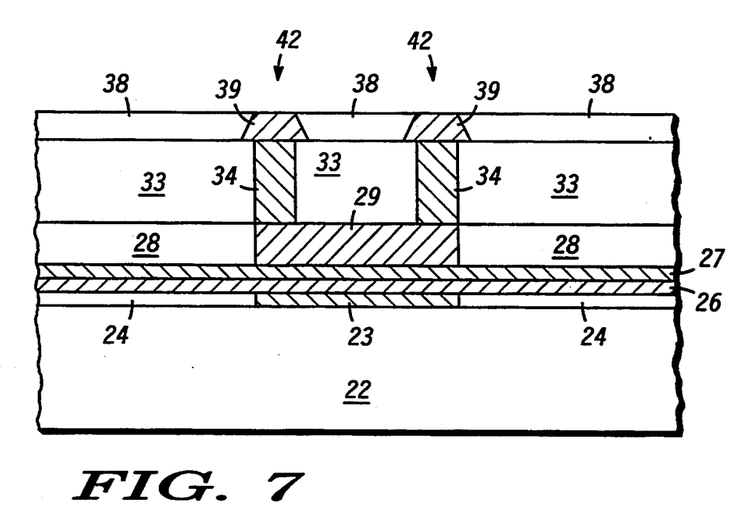
FIG. 7 is a further illustration of FIG. 5 illustrating formation of a flanged head on each section of a sectioned ring.

FIG. 7 is a further illustration of FIG. 5 illustrating formation of a flanged head on each section of a sectioned ring.

A layer of photoresist 38 is formed on layer of photoresist 33 and sectioned ring 34 to pattern a flanged head 39 on each section of sectioned ring 34. Layer of photoresist 38 is overexposed to provide a tapered opening exposing sectioned ring 34. Layer of photoresist 38 is formed having a thickness of approximately 25 microns. Copper is electroplated onto sectioned ring 34 through each tapered opening forming a flanged head 39 on each section of sectioned ring 34. Each flanged head 39 has a thickness of approximately 25 microns and a width of approximately 50 microns (at the widest point of the flange). Pedestal 29, sectioned ring 34 and flanged heads 39 form a socket 42. When insert 41 is inserted in socket 42, flanges on both structures help retain insert 41 in socket 42 when mated.

Figure 8:
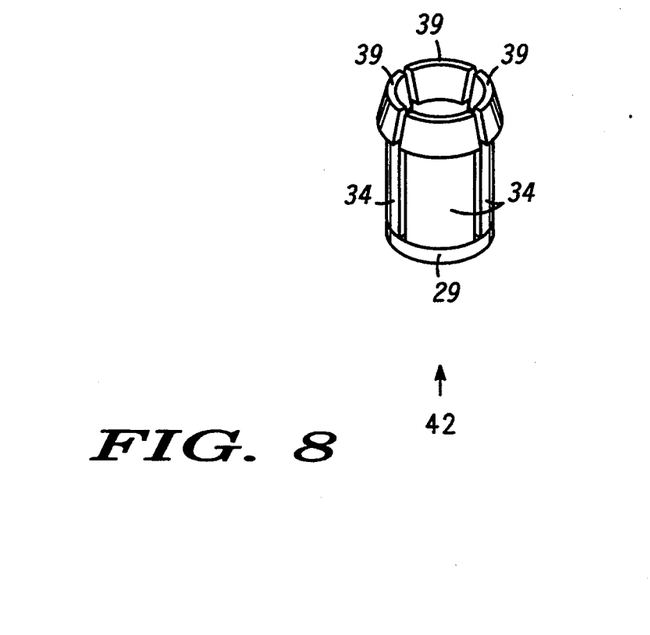
FIG. 8 is a top view of a socket illustrating a sectioned ring with flanged heads.

FIG. 8 is a top view of a socket showing a sectioned ring with flanged heads.

Viewing socket 42 from a top view illustrates each section of sectioned ring 34. In the preferred embodiment, sectioned ring 34 comprises four sections which form an opening for vertically receiving a corresponding insert. Sectioned ring 34 is formed in sections to allow each section to flex when an insert is pushed into socket 42. Gaps between each sectioned ring 34 are shown in FIG. 8 and fabrication of the gaps is described in FIG. 5. Base 29 serves as a foundation for sectioned ring 34. In the preferred embodiment, socket 42 is formed from copper. Copper is resilient and each section will return to a substantially similar location after an insert is inserted. Flanged heads 39 help retain the insert from being easily removed once inserted.

Figure 9:
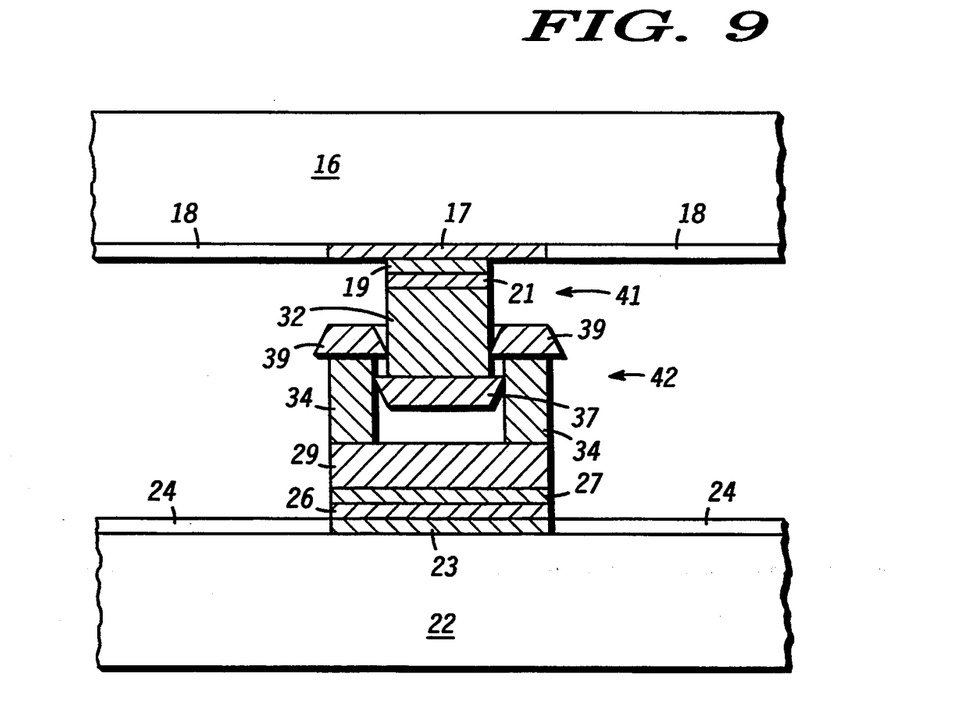
FIG. 9 is an illustration of an insert inserted in a socket.

FIG. 9 illustrates an insert vertically inserted in a corresponding socket.

Layer of photoresist 36 and 31 (FIG. 6) are removed from substrate 16 leaving layer of metal 21 (FIG. 6) exposed. Layer of metal 21 (FIG.6) is removed from substrate 16 except under cylindrical base 32. Likewise, refractory metal 19 (FIG. 6) is removed from substrate 16 except under cylindrical base 32. Insert 41 is prepared for insertion.

Layer of photoresist 38, 33, and 28 (all from FIG. 7) are removed from substrate 22 leaving layer of metal 27 (FIG. 7). Layer of metal 27 (FIG. 7) is removed from substrate 22 except under base 29. Likewise, refractory metal 26 (FIG. 7) is removed from substrate 22 except under base 29. Socket 42 is now prepared to receive insert 41.

Substrate 16 is aligned to substrate 22 such that insert 41 aligns to socket 42. Pressing substrate 16 and substrate 11 together forces insert 41 into socket 42. Insert 41 and socket 42 form an electrical and physical connection which electrically interconnects external connection terminal 17 to external connection terminal 23 and physically holds substrate 16 to substrate 22. As mentioned previously, there can be hundreds or thousands of inserts formed on a first substrate each connected to a corresponding group of sockets on a second substrate.

Figure 10:
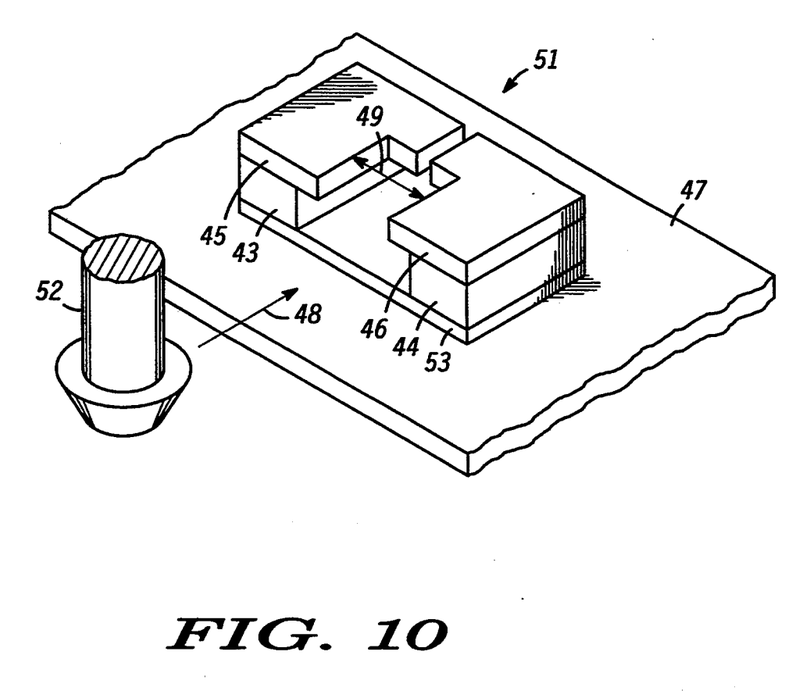
FIG. 10 is an illustration of an alternate embodiment of a socket which allows an insert to slide in and out.

FIG. 10 is an illustration of an alternate embodiment of a socket which allows temporary and permanent electrical/physical connection to a corresponding insert.

One major benefit of an insert and socket approach is flexibility. For example, a system comprising multiple integrated circuits which are coupled to a common substrate for interconnection poses several manufacturing problems. Existing technologies such as bumping require individual part testing and low error manufacturing to maintain high yields. Individual semiconductor chips must be exhaustively tested and burned in prior to coupling to the common substrate. Once each semiconductor chip is bumped and bonded to the common substrate it becomes very difficult to remove a semiconductor chip if a problem should arise. Also, system test is confined to the final product. There is no easy way to test the specific components used in a specific system prior to assembly to determine if chip to chip interactions are correct. Manufacturing an entire system and finding a flaw in the final stages of manufacture is not cost efficient. If rework of the system is not possible the entire system must be scrapped.

The interconnect system for a semiconductor chip and a substrate solves these problems. Inserts are placed on semiconductor chips. Sockets which allow semiconductor chip insert removal can be used for individual and system testing prior to final assembly. A final system having multiple integrated circuits can be formed using the process described in FIGS. 2–9 or a socket 51 which allows horizontal insertion of an insert 52.

Illustrated in FIG. 10 is a preferred embodiment of a socket 51 which horizontally accepts an insert 52. A detailed description of the process flow used to form socket 52 is described in FIGS. 3, 5, and 7 although a socket for vertically receiving an insert is shown. Insert 52 is identical to the insert formed in FIGS. 2, 4, and 6, thus, it can be used for either vertical or horizontal insertion.

In the preferred embodiment, two L-shaped metal walls 43 and 44 are formed using photoresist and electroplating techniques described in FIGS. 2-6 on a base 53 located on substrate 47. In the preferred embodiment, metal walls 43 and 44 are made of copper although other conductive materials can be used. Metal walls 43 and 44 align and couple to an external connection terminal on substrate 47. A refractory metal layer and metal layer will be formed on substrate 47 prior to the formation of L-shaped walls 43 and 44 if substrate 47 is a semiconductor substrate using an aluminum or aluminum alloy interconnect to form the external connection terminal. Base 53 is composed from the same materials as metal walls 43 and 44. Base 53 aligns to an external connection terminal (not illustrated). Base 53 provides a structure or foundation for which metal walls 43 and 44 can form a strong connection. In the preferred embodiment, each metal wall 43 and 44 is formed to a height of approximately 45 microns and is approximately 25 microns wide. An arrow 48 illustrates motion direction for insert 52 to slide in and out of a side opening in socket 51. The opening in socket 51 is approximately 75 microns wide.

Each metal wall 43 and 44 has a flange formed on a surface. The flange is used to guide an insert into a socket and to retain the insert once inserted into the socket. Metal wall 43 has a flange 45 and metal wall 44 has a flange 46. Metal walls 43 and 44 and flanges 45 and 46 form an enclosure for receiving insert 52. In a preferred embodiment, flanges 45 and 46 are formed by electroplating copper, each having a thickness of approximately 25 microns and overhanging each metal wall 43 and 44 by approximately 12.5 microns. Flanges 45 and 46 leave a top opening indicated by a double headed arrow 49 which is 50 microns wide. This provides an opening for a cylindrical base of an insert. Metal walls 43 and 44 and flanges 45 and 46 form socket 51. An insert 52 is shown to illustrate how a flanged head of an insert slides into socket 51 through the opening of socket 51. Removal of an insert is accomplished by sliding the insert out through the opening.

By now it should be appreciated that an interconnection system for a semiconductor chip and a substrate has been described. An insert and a socket provide an electrical and physical interconnection between external connection terminals of a semiconductor chip and a substrate. This approach is extremely flexible allowing permanent and temporary connections of semiconductor chips. Inserts and sockets can be formed on standard semiconductor pad sizes and at standard pad pitches so it does not limit external interconnect density whatsoever.

Fabrication of inserts and sockets is accomplished using photoresist and electroplating techniques which is simple and low cost especially when compared with other techniques such as vapor deposited bumping. Manufacturing of inserts and sockets is compatible with a high production environment. The electroplating process is a low temperature process which does not subject semiconductor chips or substrates to temperatures which can affect device structures. This can have a direct impact on final yields as some device structures are sensitive to post process temperature steps which can cause characteristic changes that end up as device failures or device performance degradations.

Insert and socket technology creates a hierarchy which opens up test, burn-in, and system strategies that cannot be accomplished with other external interconnect technologies. Substrates having sockets can be formed which allows testing of individual or multiple components (having inserts) thereby increasing the amount of test which can be performed on complex systems (raising yields and quality). Components can then be removed from test substrates and connected to burn-in substrates having sockets. After burn-in multi-chip modules or packaged integrated circuits can be formed by placing sockets on a module substrate or a package substrate. Even if an integrated circuit failure occurs at this stage in the manufacture of integrated systems components can be replaced saving time and money.

We claim:

1. An interconnect system for a semiconductor chip and substrate comprising:
   a first substrate formed of a semiconductor material having a plurality of external connection terminals;
   a refractory metal layer formed on the plurality of external connection terminals;
   a metal layer formed on the refractory metal layer;
   a plurality of metal inserts formed on the metal layer of the first substrate wherein each insert aligns to a corresponding external connection terminal;
   a second substrate having a plurality of external connection terminals;
   a metal layer formed on the plurality of external connection terminals of the second substrate;
   a plurality of metal bases formed on the metal layer of the second substrate; and
   a metal socket formed on each metal base of the second substrate for receiving a corresponding insert of the first substrate to provide physical and electrical coupling therebetween.

2. The interconnect system as recited in claim 1 wherein photoresist is used on the first and the second substrate as a pattern to form the metal inserts and sockets, respectively.

3. The interconnect system as recited in claim 2 wherein the metal inserts and sockets are formed by electroplating metal.

4. The interconnect system as recited in claim 1 wherein each metal insert comprises:
   a cylindrical base wherein the cylindrical base is coupled to one of the plurality of external connection terminals of the first substrate; and
   a flange formed on a surface of the cylindrical base.

5. The interconnect system as recited in claim 4 wherein each metal socket is formed for vertically receiving its corresponding metal insert of the first substrate.

6. The interconnect system as recited in claim 5 wherein each metal socket comprises:
   a sectioned metal ring formed on a corresponding metal base; and
   a flange formed on each section of each sectioned metal ring.

7. The interconnect system as recited in claim 4 wherein each metal socket is formed for horizontally receiving its corresponding metal insert of the first substrate.

8. The interconnect system as recited in claim 7 wherein each metal socket comprises:

an enclosure formed on the metal base for receiving a corresponding insert, the enclosure having a side opening and a top opening for receiving the insert horizontally.

9. A reusable interconnect system for a semiconductor chip and a substrate comprising:
a first substrate having a plurality of external connection terminals;
a second substrate having a plurality of external connection terminals, wherein one of said first and second substrates is the semiconductor chip;
an insert formed on each of said plurality of external connection terminals of said first substrate; and
a socket formed on each of said plurality of external connection terminals of said second substrate, wherein each socket and insert is formed by electroplating, wherein each insert of said first substrate is inserted in a corresponding socket on said second substrate for providing electrical and physical coupling therebetween, and wherein each insert of said first substrate is removable from its corresponding socket.

10. The reusable interconnect system for a semiconductor chip and a substrate as recited in claim 9 wherein each socket comprises a sectioned ring, each section of each sectioned ring having a flanged head formed thereon.

11. The reusable interconnect system for a semiconductor chip and a substrate as recited in claim 10 wherein each insert extends vertically from said first substrate and wherein each insert comprises a cylindrical base having a flanged head formed thereon.

12. The reusable interconnect system for a semiconductor chip and a substrate as recited in claim 9 wherein the external connection terminals formed on said first and second substrates have a refractory metal layer formed thereon and a metal layer formed on said refractory metal layer.

13. An electrical and physical interconnect comprising:
a semiconductor substrate;
a plurality of external connection terminals formed on said semiconductor substrate;
a socket formed on each external connection terminal of said semiconductor substrate, wherein said socket and wherein said socket comprises a sectioned ring, each section of said sectioned ring having a flanged head formed thereon.

14. The electrical and physical interconnect as recited in claim 13 wherein said socket has an opening for vertically receiving an insert.

15. The electrical and physical interconnect as recited in claim 13 wherein said socket has an opening for horizontally receiving an insert.

16. An interconnect system for providing electrical and physical interconnection between a semiconductor substrate and a substrate comprising:
a first substrate having a plurality of external connection terminals;
a second substrate having a plurality of external connection terminals, wherein one of said first and second substrates is a semiconductor substrate;
an insert formed on each of said plurality of external connection terminals of said first substrate, and;
a socket formed on each of said plurality of external connection terminals of said second substrate, each socket of said second substrate having an opening for receiving a corresponding insert of said first substrate, each insert being forcibly inserted through an opening of its corresponding socket for physical and electrical coupling therebetween.

17. An interconnect system as recited in claim 16 wherein each insert has a flanged head.

18. An interconnect system as recited in claim 16 wherein each socket of said second substrate has a sectioned ring for flexing when a corresponding insert of said first substrate is inserted therein.

19. An interconnect system as recited in claim 18 wherein each section of said sectioned ring of each socket is flanged and wherein said first and second substrates can be pulled apart for separating each insert from its corresponding socket.

* * * * *